(12) United States Patent
Mathew et al.

(10) Patent No.: US 11,915,983 B2
(45) Date of Patent: Feb. 27, 2024

(54) STRUCTURES AND METHODS OF FABRICATING ELECTRONIC DEVICES USING SEPARATION AND CHARGE DEPLETION TECHNIQUES

(71) Applicant: Applied Novel Devices, Inc., Austin, TX (US)

(72) Inventors: Leo Mathew, Austin, TX (US); Rajesh Rao, Austin, TX (US); Daniel Fine, Austin, TX (US); Vishal Trivedi, Chandler, AZ (US)

(73) Assignee: APPLIED NOVEL DEVICES, INC., Austin, TX (US)

( * ) Notice: Subject to any disclaimer, the term of this patent is extended or adjusted under 35 U.S.C. 154(b) by 0 days.

(21) Appl. No.: 18/101,134

(22) Filed: Jan. 25, 2023

(65) Prior Publication Data

US 2023/0170263 A1 Jun. 1, 2023

Related U.S. Application Data

(62) Division of application No. 16/931,051, filed on Jul. 16, 2020, now Pat. No. 11,610,819.

(51) Int. Cl.
*H01L 21/8238* (2006.01)
*H01L 21/78* (2006.01)
*H01L 27/092* (2006.01)

(52) U.S. Cl.
CPC .. *H01L 21/823807* (2013.01); *H01L 21/7806* (2013.01); *H01L 21/823828* (2013.01); *H01L 27/092* (2013.01)

(58) Field of Classification Search
CPC .................................................. H01L 21/823885
See application file for complete search history.

*Primary Examiner* — John A Bodnar
(74) *Attorney, Agent, or Firm* — RANGARAJAN SOURIRAJAN; RAJAN LAW OFFICE LLC

(57) ABSTRACT

A method of fabricating an electronic device can include forming a plurality of vertical channels having sidewalls over a substrate, and forming gate dielectric regions over portions of the vertical channels and planar regions adjoining the vertical channels. Gate electrode regions are then formed over portions of the gate dielectric regions. The gate electrode material and the vertical channel region are doped and sized to enable full depletion of charges during operation. Source and body tie regions are formed on the vertical sidewalls by doping with a p-type or n-type dopant. Dielectric regions over the gate electrode regions are formed to electrically isolate the gate electrode regions from the source regions. A metallic layer is formed over the first side of the substrate having the vertical channels. Stress is then induced within the substrate by annealing and/or cooling to separate a semiconductor region of the substrate and the metallic layer from the remaining portion of the substrate. Drain electrode contacts are formed over the semiconductor region while gate electrode and source electrode contacts are formed by etching portions of a metallic layer formed over the first side of the substrate.

11 Claims, 15 Drawing Sheets

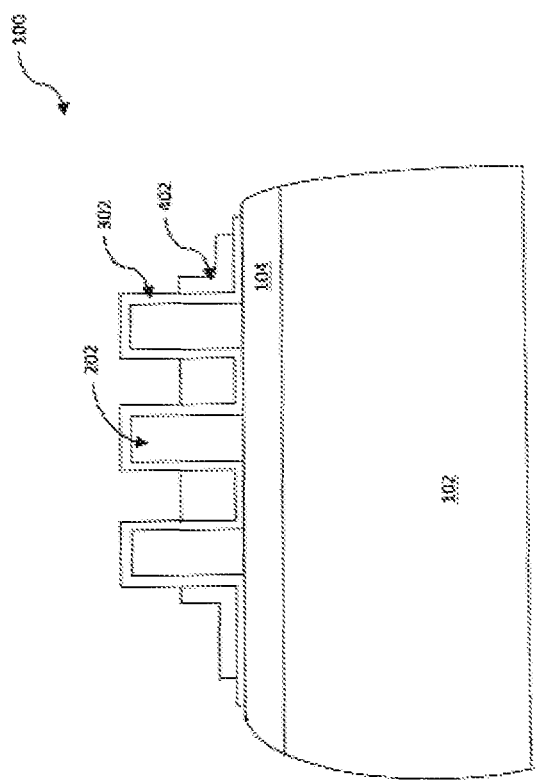

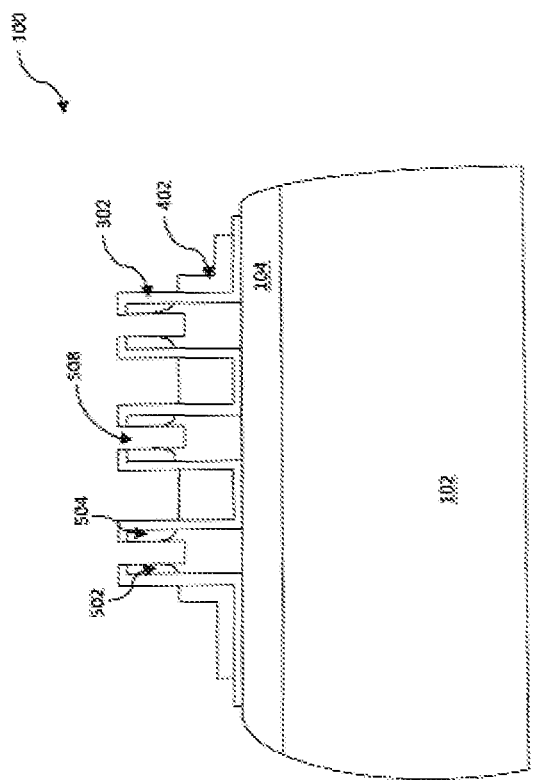

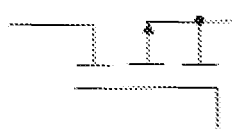
FIG. 12C
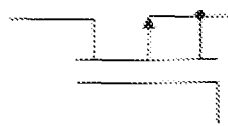
FIG. 12B
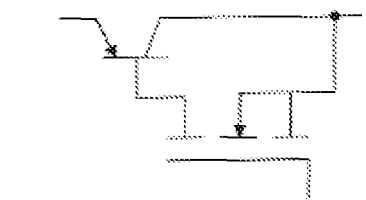
FIG. 12F
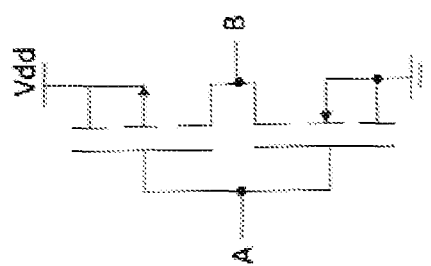
FIG. 12E
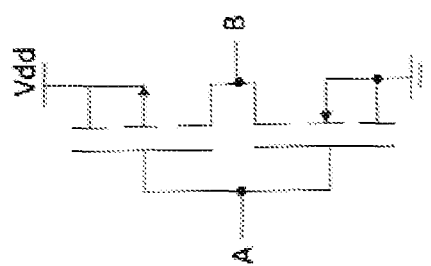
FIG. 12A
FIG. 12D

STRUCTURES AND METHODS OF FABRICATING ELECTRONIC DEVICES USING SEPARATION AND CHARGE DEPLETION TECHNIQUES

CROSS-REFERENCE TO RELATED APPLICATIONS

This application is a divisional application of parent application U.S. application Ser. No. 16/931,051, filed Jul. 16, 2020, entitled "Structures and Methods of Fabricating Electronic Devices Using Separation and Charge Depletion Techniques," which is incorporated herein in its entirety by reference.

BACKGROUND OF THE INVENTION

The inventive concepts relate to the field of electronic devices and, in particular, to the manufacture of and the structure of electronic devices using separation and charge depletion techniques.

Semiconductor substrates need to be thick enough to be handled in production lines but this thickness can lead to degraded electrical performance due to factors such as the resistance imparted by the thick substrates. This limitation is addressed by various techniques such as mechanically thinning the substrates towards the end of the process or starting with thin layers of the substrate bonded to insulating materials on wafers such as Silicon on Insulator (SOI) wafers. There are limitations to thinning and handling substrates by chemical and mechanical means such as grinding and etching. The costs and electrical limitations associated with SOI wafers prevent them from being used in devices such as vertical power switching devices.

Accordingly, the need exists for methods of fabricating electronic devices on a layer separated from a substrate and structures of electronic devices for such methods. There is a need for structures that reduce leakage and provide higher drive current and enable control of the dopant depleted regions of the electronic device with gates from more than one side. A uniformly undoped region or lightly doped region is provided within the channel region to enable such fully depleted structures.

SUMMARY OF THE INVENTION

According to an aspect of the inventive concept, an electronic device includes a substrate of a semiconductor material having a plurality of vertical sidewall regions with vertical walls. A gate dielectric region is formed over a portion of the sidewall regions and over planar regions adjoining the sidewall regions. A gate electrode region is formed over a portion of the gate dielectric region this part of the sidewall region comprises the channel region. Source electrode region, body and a body tie regions are formed on other portions of the vertical sidewall regions. The body region is an undoped region or lightly doped region provided within the channel region to enable a fully depleted region during operation. The source electrode region is doped with a first dopant and a body tie region is a heavily doped part of the body region that is doped with a second dopant. A dielectric region is formed over the gate electrode region to electrically isolate the source electrode region from the gate electrode region. A first metallic layer formed over a first side of the substrate is etched to form a gate metal electrode pad and a source metal electrode contact. A first semiconductor layer having a surface with characteristic texture is formed by inducing stress in the substrate and separating the first semiconductor layer and the first metallic layer from a second portion of the substrate. A drain metal electrode contact is formed over the surface of the first semiconductor layer with the characteristic texture.

In another aspect of the inventive concept, a Power MOSFET includes the electronic device structure described above with an n+ doped source region, body region that can fully deplete of charges during operation, a p+ doped body tie region, and an n+ doped first semiconductor layer.

In another aspect of the inventive concept, an Insulated Gate Bipolar Transistor (IGBT) includes the electronic device structure described above with a p+ doped first semiconductor layer having an n− buffer layer, body region that can fully deplete of charges during operation, a p+ doped body tie region, and an n-doped source region.

In another aspect of the inventive concept, a Complementary Metal Oxide Semiconductor (CMOS) includes the electronic device structure described above wherein a first portion of the structure is doped to form a PMOSFET and a second portion of the structure is doped to form an NMOSFET, to collectively form a CMOS.

In another aspect of the inventive concept, an electronic device is fabricated by forming a plurality of channel structures over a first side of a semiconductor substrate, the plurality of channel structures having walls substantially perpendicularly from the first side of the semiconductor substrate. Gate dielectric regions are then formed over a portion of the plurality of channel structures and planar regions. Gate electrode regions are formed over a portion of the gate dielectric regions, and source regions and body tie regions are formed on the walls of the plurality of channel structures. The channel structures have an aspect ratio and dimensions such that the width of the channel region is smaller than the length of the gate electrode region. The channel structures also have a doping characteristic that makes them fully depleted of charges during operation. Dielectric regions are then formed over the gate electrode regions to electrically isolate the gate electrode regions from the source regions. A first metallic layer is formed over the first side of the semiconductor substrate and stress is induced within the semiconductor substrate by annealing and/or cooling the semiconductor substrate and the first metallic layer. A first semiconductor region and the first metallic layer are separated from the semiconductor substrate, wherein the first semiconductor region is a first portion of the semiconductor substrate. Backside metal regions are formed over the first semiconductor region, the backside metal regions capable of being drain metal electrode contacts, and portions of the first metallic layer are etched to form gate metal electrode contacts and source metal electrode contacts.

Other features and advantages of the inventive concepts will become apparent in view of the detailed description and the accompanying drawings.

BRIEF DESCRIPTION OF THE DRAWINGS

FIG. 4 illustrates, according to example embodiments of the inventive concepts, a cross-sectional view of the workpiece of FIG. 3 after formation of gate electrode region;

FIGS. 5A-5D illustrate, according to example embodiments of the inventive concepts, cross-sectional views of the workpiece of FIG. 4 after formation of a set of junctions for source and body;

FIGS. 12A-12D schematically illustrate, according to example embodiments of the inventive concepts, the various types of MOSFETs that can be formed using the various methods and structures described herein, FIG. 12E illustrates an Insulated-Gate Bipolar Transistor (IGBT), and FIG. 12F illustrates a Complementary Metal Oxide Semiconductor (CMOS).

Figure 1:
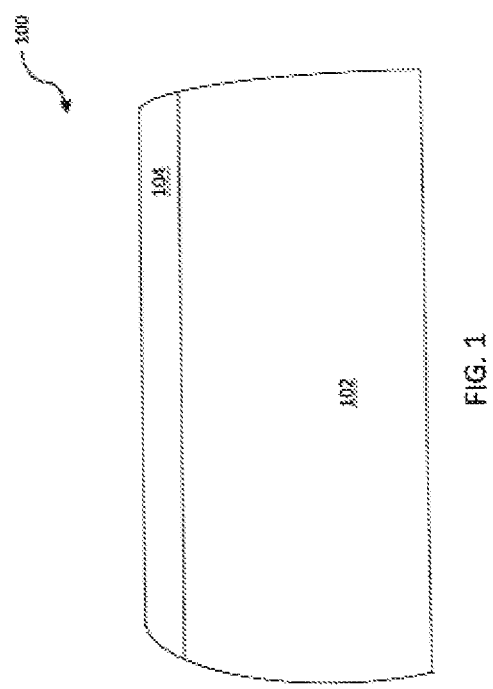
FIG. 1 illustrates a cross-sectional view of a portion of a workpiece comprising a substrate according to example embodiments of the inventive concepts.

Skilled artisans appreciate that elements in the figures are illustrated for simplicity and clarity and have not necessarily been drawn to scale. For example, the dimensions of some of the elements in the figures may be exaggerated relative to other elements to help to improve understanding of example embodiments of the inventive concepts.

DETAILED DESCRIPTION OF THE PREFERRED EMBODIMENTS

Disclosed embodiments relate to structures and methods of fabricating electronic devices using separation and charge depletion techniques.

Group numbers corresponding to columns within the Periodic Table of the elements use the "New Notation" convention as seen in the *CRC Handbook of Chemistry and Physics*, $81^{st}$ Edition (2000-2001).

The term "metal" and any of its variants are intended to refer to a material that includes an element that is (1) within any of Groups 1 to 12, or (2) within Groups 13 to 15, an element that is along and below a line defined by atomic numbers 13 (Al), 50 (Sn), and 83 (Bi), or any combination thereof. Metal does not include silicon or germanium. Note, however, that a metal silicide is a metallic material.

As used herein, the terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

In addition, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Referring now to the drawings, where like elements are designated by like reference numerals, FIG. 1 illustrates a workpiece 100 comprising a substrate 102. The substrate 102 may be formed of any type of material, either conductive, semi-conductive or insulative. In one embodiment, the substrate 102 may be a semiconductor substrate comprising a Group 14 element (silicon, germanium, or carbon), any combination of Group 14 elements (silicon germanium, carbon-doped silicon, silicon germanium carbon, or the like), or Group 13-Group 15 semiconductors (gallium arsenide, gallium nitride, indium phosphide, indium arsenide, gallium indium arsenide, or the like). The substrate 102 can include a substantially monocrystalline, amorphous, or polycrystalline semiconductor substrate. In other embodiments, various combinations of materials may form the substrate 102.

The substrate 102 may be doped with materials such as Boron, Phosphorous, Arsenic, Antimony, Bismuth, Carbon, Gallium, Indium among others, to increase electrical conductivity. N-type dopants may be Phosphorous, Arsenic, Antimony, or Bismuth while p-type dopants may be Boron, Gallium or Indium. The doping concentration may be approximately between $10^{17}$ to $10^{20}$ atoms per cm$^3$ of dopants such as Boron, Phosphorous, Arsenic, Antimony, Bismuth, Carbon, among others. The substrate 102 may have a thickness, for example, of at least approximately 50 microns or at least approximately 5000 microns.

In certain embodiments, the workpiece 100 may be a semiconductor wafer that is typically a substantially circular slice of a semiconductor material such as silicon having a diameter of about 150 mm to 675 mm. In other embodiments, the workpiece 100 may be a silicon-on-insulator (SOI) wafer wherein the substrate 102 may reside over a dielectric (not shown) such as silicon oxide. In other embodiments, the substrate 102 may reside over a bulk silicon material (not shown) that provides mechanical support to workpiece 100.

In an embodiment of the inventive concepts, the substrate 102 can have an overlayer called an epitaxial region 104 which could be formed of one or more of the materials mentioned above with variations from the substrate 102 and may be doped with materials such as Boron, Phosphorous, Arsenic, Antimony, Bismuth, Carbon, Gallium, Indium among others, to have a different electrical conductivity from the substrate 102. N-type dopants may be Phosphorous, Arsenic, Antimony, or Bismuth while p-type dopants may be Boron, Gallium or Indium. The doping concentration may be approximately between $10^{13}$ to $10^{16}$ atoms per cm$^3$ of dopants such as Boron, Phosphorous, Arsenic, Antimony, Bismuth, Carbon, among others. The substrate 102 may have a thickness, for example, of at least approximately 50 microns or at least approximately 200 microns.

The epitaxial region 104 may be formed using vapor phase epitaxy (VPE), molecular beam epitaxy (MBE), liquid phase epitaxy (LPE), or other deposition processes.

Figure 2:
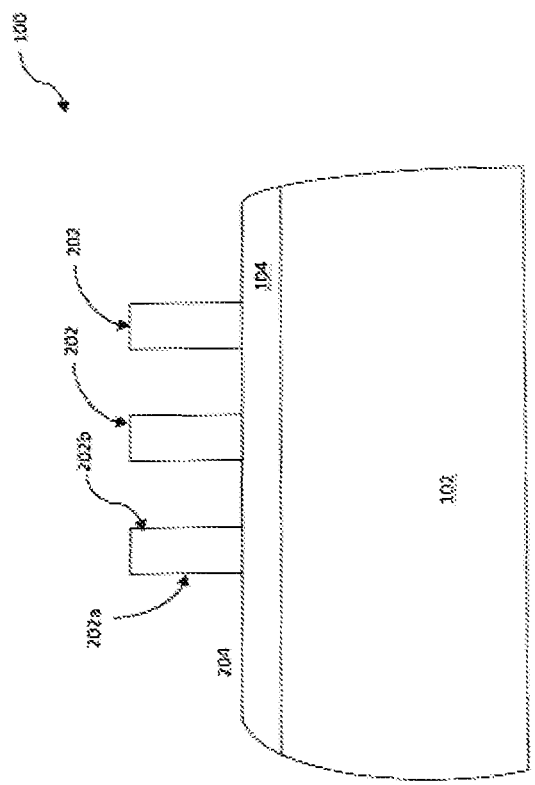
FIG. 2 illustrates, according to example embodiments of the inventive concepts, a cross-sectional view of the workpiece of FIG. 1 after formation of plurality of channel structures.

FIG. 2 illustrates the workpiece 100 after formation of a plurality of channel structures 202. The plurality of channel structures 202 may have substantially monocrystalline wall that extends substantially perpendicularly from the surface of the substrate 102 or the surface of the epitaxial region 104. The plurality of channel structures 202 can be formed by a combination of process that uses photoresists or other materials such as oxides, nitrides or metals as masks to etch away portions of semiconductor regions by wet chemical, or plasma etching processes. A plurality of these channel structures 202 with vertical walls and some adjoining regions without these vertical walls called planar regions 204 may be formed.

The opposing faces 202a, 202b of the wall of the channel structures 202 form at least two surfaces on which a gate dielectric and gate electrode may be formed. The gate dielectric formed on a first face of the wall may differ from the gate dielectric formed on a second face of the wall. Similarly, the gate electrode formed on the first face of the wall may differ from the gate electrode formed on the second face.

Figure 3:
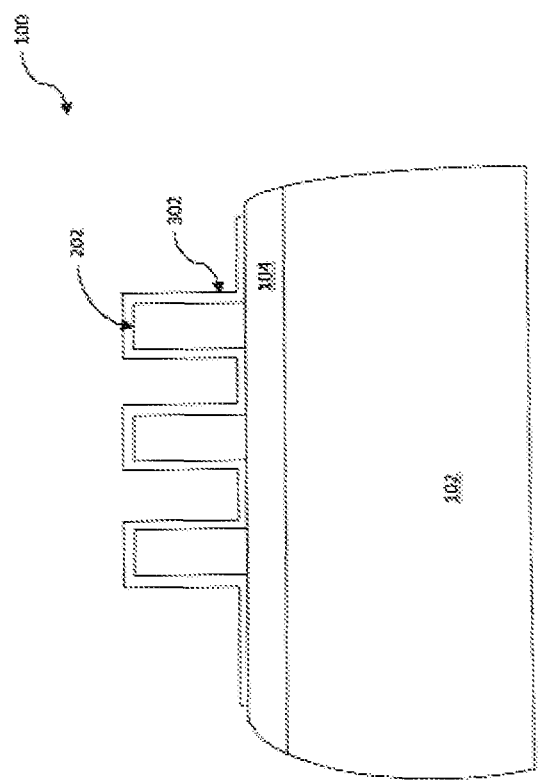
FIG. 3 illustrates, according to example embodiments of the inventive concepts, a cross-sectional view of the workpiece of FIG. 2 after formation of gate dielectric region.

FIG. 3 illustrates the workpiece 100 after a gate dielectric region 302 is formed over both the plurality of channel structures 202 and the planar regions 204. In some embodiments, the gate dielectric region 302 may be of different thickness in different regions and the thickness may range from about 1 nm to 1000 nm. For example, the gate dielectric region 302 over the horizontal planar regions 204 may be significantly thicker than over the plurality of channel structures 202. The gate dielectric region 302 may be made of materials such as silicon-dioxide, silicon-nitride, aluminum oxide, high-k dielectric materials such as hafnium oxide among others. The process used to form the gate dielectric region 302 may be one or more of oxidation in a thermal furnace, deposition by Chemical Vapor Deposition (CVD), Physical Vapor Deposition (PVD), Atomic layer deposition (ALD), or other deposition processes. The gate dielectric region 302 provides electrical isolation between the substrate 102 and a subsequently formed gate electrode structure as well as providing an etch stop for use when patterning the subsequently formed gate electrode structures.

FIG. 4 illustrates the workpiece 100 after a gate electrode region 402 is formed and patterned over the gate dielectric region 302 which is formed over both the plurality of channel structures 202 and the planar regions 204. The gate electrode region 402 may be made of materials such as poly silicon, amorphous silicon, metals such as aluminum, titanium, nickel, molybdenum or combinations such as titanium-nitride and may be further electrically doped with materials such as boron, phosphorous, or arsenic. The process used to form the gate dielectric region 402 may be one or more of thermal furnace-based deposition by CVD, PVD, ALD, Plasma Enhanced Chemical Vapor Deposition (PECVD), evaporation of combinations of conductive materials, or other deposition processes. The thickness of the gate electrode region 402 is preferably about 50 nm to 5000 nm and a resistivity of $10^{-3}$ Ω-cm or less.

In an embodiment, shown in FIG. 4, the gate electrode region 402 has been removed over portions of the vertical walls of the plurality of channel structures 202 and the planar regions 204. This can be accomplished by process such as planarization, patterning and etch back of the deposited gate electrode region 402. In one embodiment, a photo-resist is spun over the entire substrate and planarized. The photo-resist is then etched back to expose portions of the deposited gate electrode regions 402 that are above certain height and this is etched away using Reactive Ion etching processes. The conductivity of the gate electrode region 402 may be controlled by doping the region with dopants during the deposition process or during subsequent Ion-implantation procedures.

In an embodiment (not shown in FIG. 4), the gate electrode 402 is deposited conformally over the gate dielectric 302. In this embodiment, the deposited electrode 402 is not thick enough to fill the trenches and other materials such as oxide, nitride or photoresist or combinations of such materials can be used to fill and planarize the workpiece 100. These materials are then etched back or polished to expose and further remove portions of the gate electrode and gate dielectric regions.

In one embodiment, the gate electrode region 402 is a boron-saturated (p+) polysilicon formed by thermal decomposition of a silane ($SiH_4$) bearing ambient at a temperature of approximately 500° to 650° C. For in-situ doping, a boron containing element or compound such as diborane is provided in the ambient. In another embodiment, the gate electrode region 402 may be formed by CVD of undoped polysilicon with subsequent ion-implantation of dopants such as boron, phosphorus, arsenic, or antimony.

FIGS. 5A-5D illustrate the workpiece 100 after source regions 502 and body tie regions 504 are formed by doping portions of the walls of the plurality of channel structures 202 that are not covered by the gate electrode region 402. Four embodiments of the inventive concepts of the source and body regions are shown in FIGS. 5A-5D. In an embodiment, shown in FIG. 5A, the source regions 502 are on the sides and the body tie regions 504 are implanted vertically into the channel structures 202. In another embodiment, shown in FIG. 5B, the source regions 502 and body tie regions 504 are implanted asymmetrically from different sides of the vertical walls of the channel structures 202. In yet another embodiment, shown in FIG. 5C, a portion of the vertical walls 508 has been removed after the source regions 502 and the body regions 504 have been implanted. In yet another embodiment, shown in FIG. 5D, the workpiece 100 may have a combination of source regions 502 and body tie regions 504 illustrated in FIGS. 5A-5C.

In an embodiment (not shown), the body-tie region can be lightly doped or the same doping as the body region.

The doping of the source regions 502 and body tie regions 504 can be carried out by process such as ion-implantation and includes a dopant of the opposite or significantly higher conductivity type as compared to the substrate 102, so that a p-n junction or a high-low junction is formed. The doped source region 502 can include an n-type or a p-type dopant. The doped source region 502 can be formed by gas-phase furnace doping, a spin-on dopant, depositing or growing a doped layer (a doped glass, a doped semiconductor layer (amorphous, polycrystalline, substantially monocrystalline)), or by implantation. An anneal or dopant drive may be performed if needed or desired. The peak concentration of the doped source region 502 is, for example, at least approximately $10^{17}$, $10^{18}$, $10^{19}$ or $10^{20}$ atoms/cm$^3$. The junction depth of the doped source region 502 is, for example, at least approximately 0.01 microns or at least approximately 0.1 microns.

Figure 5A:
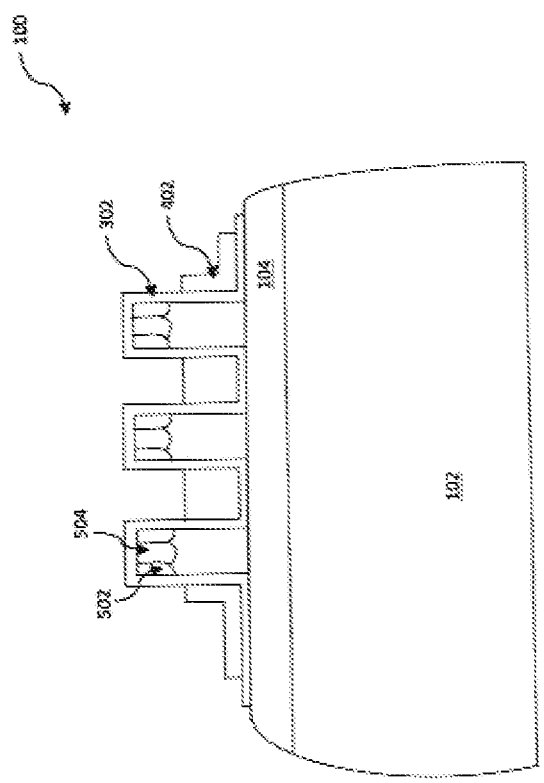
Figure 5B:
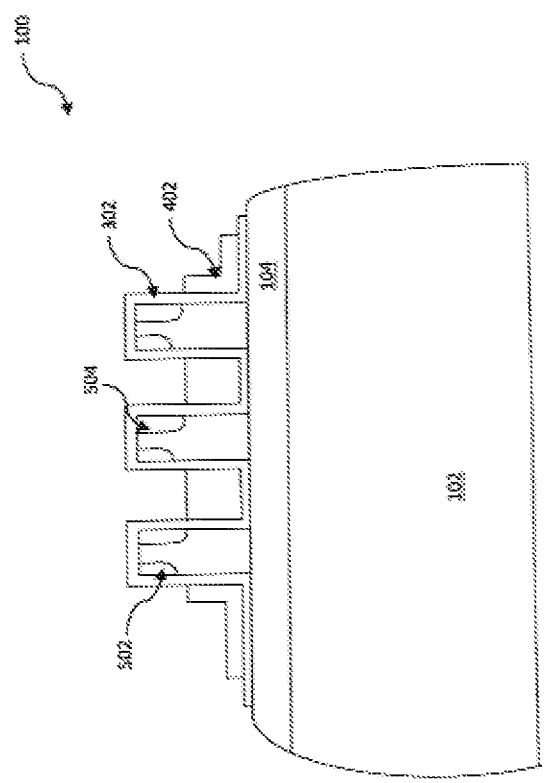
Figure 5D:
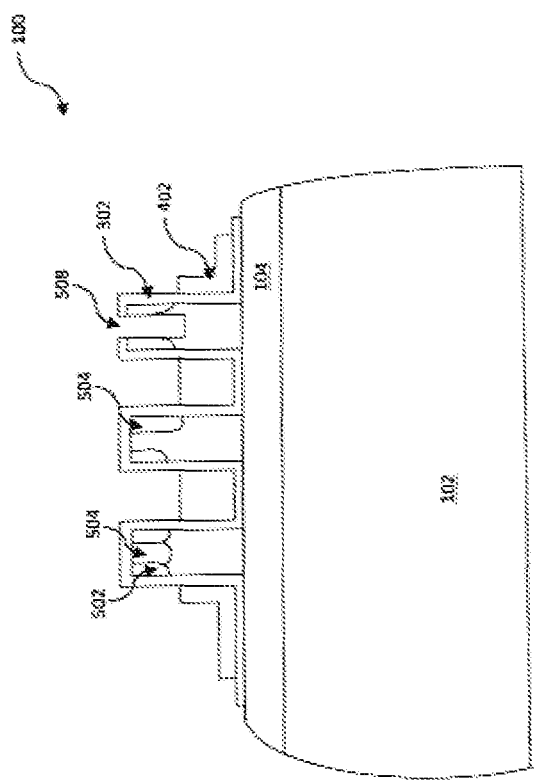

In one embodiment, shown in FIG. 5B, the source region 502 and the body tie region 504 are formed by implanting different species from each side at an angle yielding an asymmetrically doped region on each side. The asymmetry is caused due to the significant shadowing of the implanted species by the walls of the channel structures 202. This asymmetrically formed junctions are highly desirable as it reduces costs in producing these junctions compared to the other embodiments. In addition, these asymmetric junctions may be formed without any photolithographic process and hence leads to a significant density of the vertical walls of the channel structures 202 to be achieved in a product.

Figure 6:
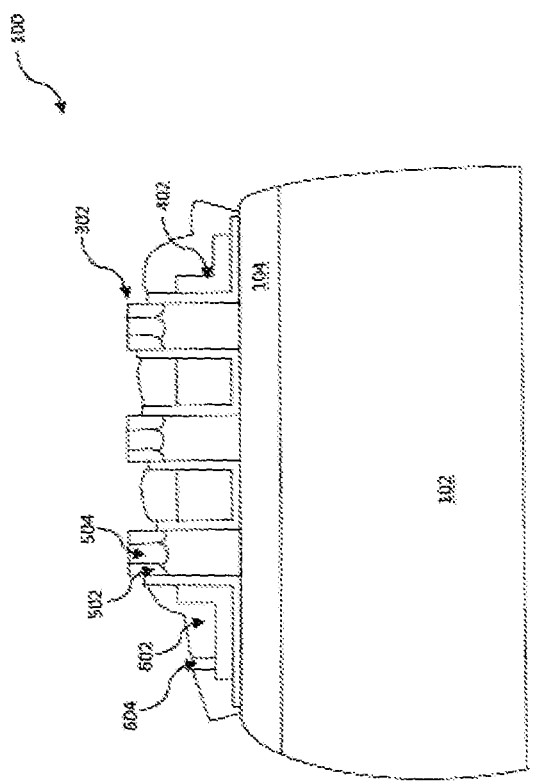
FIG. 6 illustrates, according to example embodiments of the inventive concepts, a cross-sectional view of the workpiece of FIG. 5A after formation of a dielectric region that has been etched away over the source and gate contact regions.

FIG. 6 illustrates the workpiece 100 after an inter-layer dielectric region 602 is formed over the gate-electrode region 402 and portions of the plurality of channel structures 204. This region is formed by depositing dielectric layers such as oxide, nitride and low-k dielectrics by furnace, CVD, ALD, PVD or a combination of these processes. The inter-layer dielectric regions 602 may be etched away in a small region in the planar region 204 to form gate electrode contact region 604. Further, the interlayer dielectric is also removed over portions of the plurality of channel structures to expose the source 502 and body tie regions 504, using processes similar to that employed to remove the gate electrode from the top of the plurality of channel structures in FIG. 4. During this process the gate dielectric 302 is also removed over the source 502 and body tie regions 504.

Figure 7:
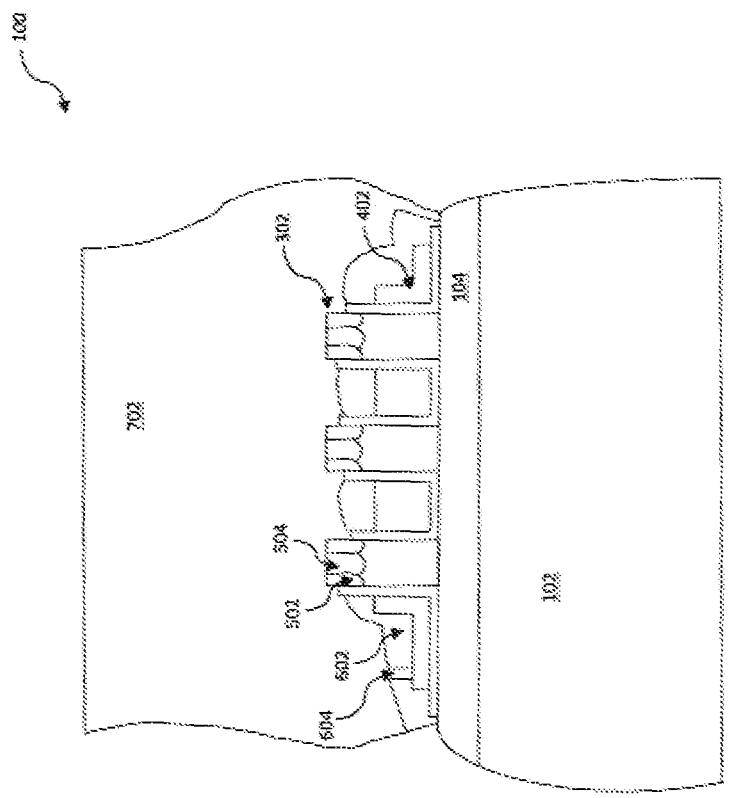
FIG. 7 illustrates, according to example embodiments of the inventive concepts, a cross-sectional view of the workpiece of FIG. 6 with a continuous conductive region formed over the source and gate electrode regions.

FIG. 7 illustrates the workpiece 100 after a continuous conductive region 702 is formed over the substrate 102 and the regions formed on them as shown in FIG. 6. The continuous conductive region 702 can include a metallic layer and have one or more films therein. For example, the metallic layer can include an adhesion film, a barrier film, a seed film, another suitable film, or any combination thereof. The adhesion film can include a refractory metal (titanium, tantalum, tungsten, or the like), and the barrier film can include a metal nitride (TiN, TaN, WN, or the like) or a metal semiconductor nitride (TaSiN, WSiN, or the like). The seed film can include a transition metal or transition metal alloy, and in a particular embodiment, the seed film can include titanium, nickel, palladium, tungsten, copper, silver, or gold. In some embodiments, these materials can be further annealed to form silicides or other alloys formed during the annealing process. In other embodiments, other materials may be used within the adhesion film, barrier film, seed film, or any combination thereof. The continuous conductive region 702 can be formed by a combination of physical vapor deposition (PVD, such as evaporation or sputtering), CVD, ALD, electrochemistry, another suitable method, or any combination thereof.

In an embodiment, the continuous conductive region 702 by itself, may have a thickness, such that it provides sufficient mechanical support to a subsequently formed semiconductor region, the semiconductor region being formed from a portion of the substrate 102. The continuous conductive region 702 may be substantially thicker and have a relatively higher conductance as compared to the semiconductor region. In an embodiment, continuous conductive region 702 can have a thickness of at least approximately 10 microns or at least approximately 100 microns, and in another embodiment, the continuous conductive region 702 can have a thickness no greater than approximately 2 mm or no greater than approximately 100 mm.

In one embodiment, the conductive region 702 can be formed after a separation-enhancing species such as hydrogen is incorporated within the substrate 102 by a process such as ion-implantation to aid in the separation of the first semiconductor layer. As will be described later, the separation-enhancing species can help embrittle and separate a portion of the substrate 102, in the form of a semiconductor layer, from a remaining portion of the substrate 102.

Figure 8:
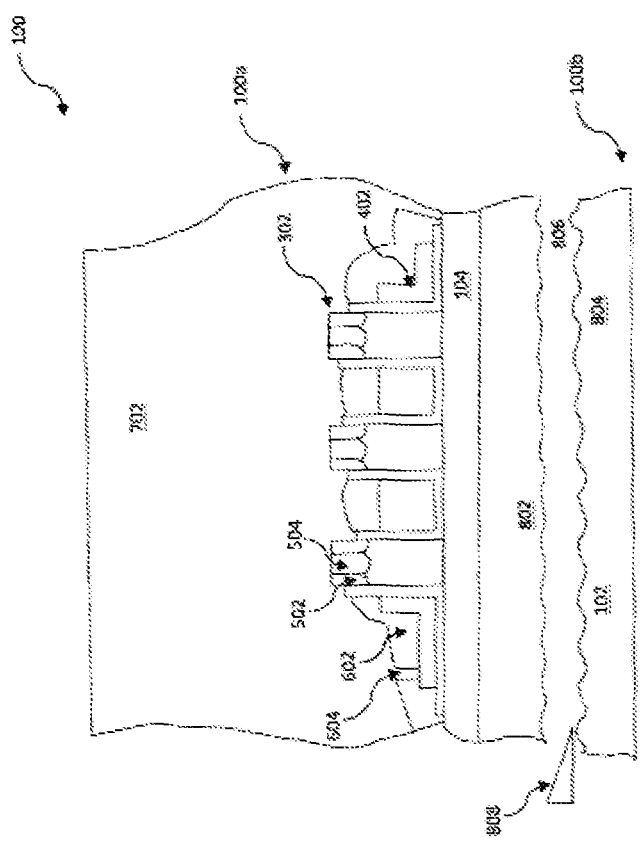
FIG. 8 illustrates, according to example embodiments of the inventive concepts, a cross-sectional view of a portion of a workpiece of FIG. 7, after the incorporation of stress to aid in the separation of the semiconductor region followed by separation of the semiconductor region using a mechanical wedge in the stressed semiconductor region to separate the semiconductor region.

FIG. 8 illustrates the workpiece 100 after the separation of a portion of the substrate 102 containing the features such as a plurality of channel structures 202, gate dielectric region 302, gate electrode region 402, and inter-layer dielectric region 602 from the rest of the substrate 102. This separation may be aided by stress built up by annealing the workpiece 100 at higher temperatures which builds up stress in the layers due to the thermal co-efficient mismatch between the continuous conductive region 702 and the semiconductor region 802. In addition, embrittlement due to the separation enhancement species 704 may further aid the separation. The temperature and time of the anneal can depend on the particular application for the semiconductor device being formed.

The thickness of the semiconductor region 802 may be based at least in part on the composition of the substrate 102 and the particular electronic application, such as a power switching MOSFET or Insulated Gate Bipolar transistor. In an embodiment, the semiconductor region 802 can have a thickness of at least approximately 1 micron or at least approximately 20 microns, and in another embodiment, the semiconductor region 802 can have a thickness no greater than approximately 100 microns or no greater than approximately 50 microns. The thickness of the semiconductor region 802 is determined at least in part by the thermal mismatch stresses. As the thermal mismatch stress increases due to an increase in the anneal temperature, the anneal time, or a combination of the anneal temperature and time, the thickness of the semiconductor region may increase. Conversely, as the desired thickness of the semiconductor region 802 decreases, the anneal temperature, the anneal time, or a combination of the anneal temperature and time may decrease.

The separation may occur during the heating or cooling or thereafter. For example, a mechanical operation may be used to help with the separation. In a particular embodiment, the separation may occur by cleaving or fracturing the substrate 102 at a location at or near where the separation is to be performed. A wedge, wire, gases or fluids or saw may be used to aid in the mechanical separation such as the wedge 808, as illustrated in FIG. 8. The wedge 808 is representative of any mechanical force in between the separated regions. In another embodiment, a metallic paste can be mechanically applied over the workpiece 100, and a stiffened or handling substrate can be attached to the metallic paste and used to aid the separation operation. In a particular embodiment, the separation can be analogous to an exfoliation operation. The combination of the semiconductor region 802 that was separated from substrate 102, the continuous conductive region 702, and the plurality of channel structures 202 and regions embedded therein are now rugged enough to be handled mechanically for further processing. A characteristic texture is also incorporated at the region of separation between 802 and 804 called the textured region 806. This texture can be controlled by the parameters used in forming the continuous conductive region 702 and the wedge 808 in order to benefit the performance of the final product. A characteristic texture due to the separation process will yield complementary ridges and surface topography on the two surfaces 802 and 804. The parts 100a and 100b caused by the separation process can be further processed as individual workpieces.

Figure 9:
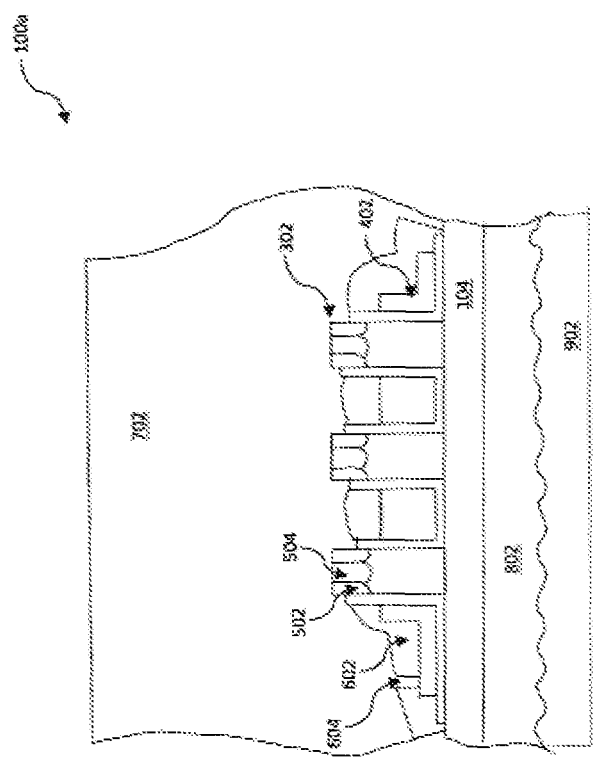
FIG. 9 illustrates, according to example embodiments of the inventive concepts, a cross-sectional view of a portion of a workpiece of FIG. 8 following metal deposition on the textured regions formed by the separation from the substrate to form drain electrode regions.

FIG. 9 illustrates the workpiece 100a after the process of separation that has been further processed by deposition of backside conductive layer 902 using semiconductor or metallic layers such as PECVD amorphous silicon, metals using physical vapor deposition, electrochemical process such as plating or a combination thereof. The backside conductive layer 902 maybe further thickened by forming a backside handling layer using conductive tapes, additional electroplated layers or nonconductive layers and tapes such as photoresists, plastic layers such as Ethyl Vinyl Acetate, PDMS among others.

Figure 10:
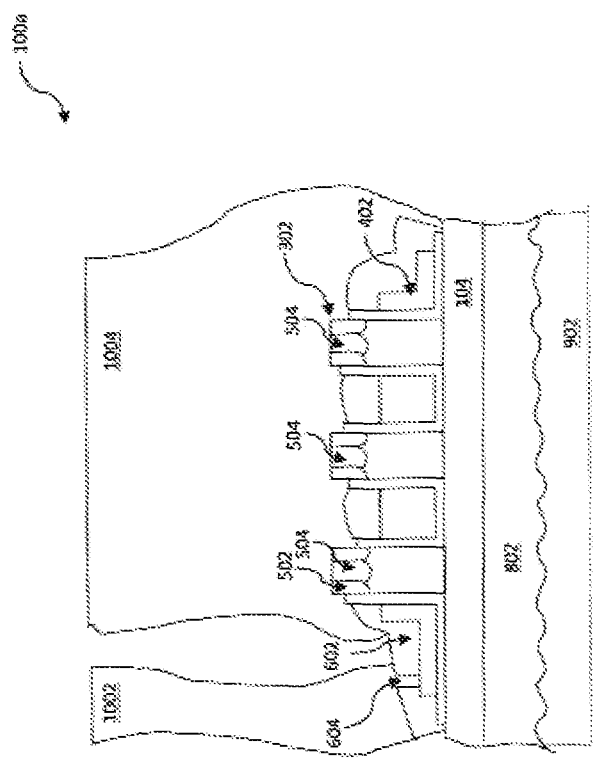
FIG. 10 illustrates, according to example embodiments of the inventive concepts, a cross-sectional view of the portion of workpiece of FIG. 9 after the contiguous metal region is patterned to form gate electrode and source regions using a metal etch process. This forms a substantially completed electronic device with three electrodes.

FIG. 10 illustrates the workpiece 100a after the process of separation that has been further processed to etch away portions of the continuous conductive region 702 to yield metallic gate electrode region 1002 and metallic source electrode region 1004. This is carried out by process such as wet metal etch using photo-resist layers as masks and is well known to skilled artisans in the semiconductor industry. The backside conductive layer 902 can now serve as the drain electrode of a substantially complete power switching device.

Figure 11:
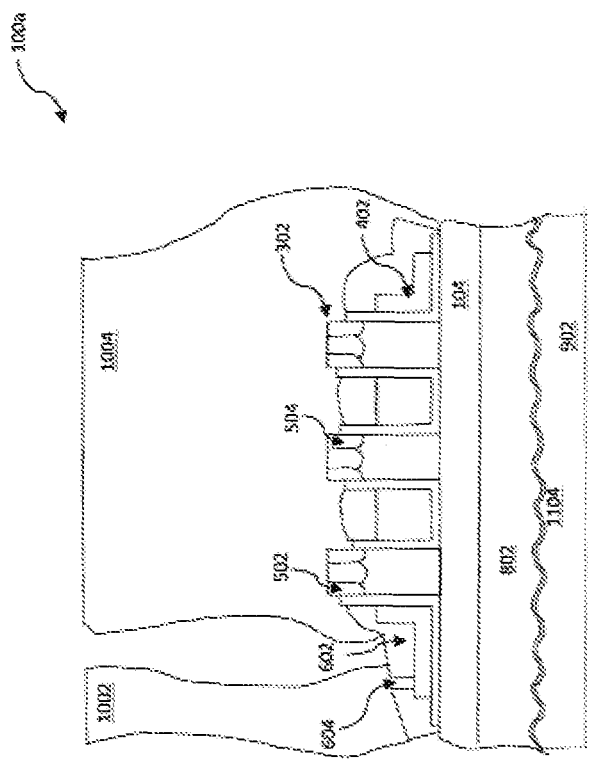
FIG. 11 illustrates, according to example embodiments of the inventive concepts, a cross-sectional view of the workpiece of FIG. 9 after a combination of a undoped and doped semiconductor layers are formed before metal regions are formed on the textured regions that were formed by the separation from the substrate to form junctions and drain electrode regions.

In another embodiment of the inventive concepts, a p-n junction in the electronic device formed using the separation and patterning techniques described herein yields an Insulated Gate Bipolar Transistor (IGBT), a schematic of which is shown in FIG. 11. The figure shows the workpiece 100a, after it has been further processed to form a drain region that is comprised of buffer regions 1102 that abut the semiconductor region 802 and are intrinsic or doped (either n+ or p+) before deposition of backside metal 902. These regions when biased inject electronic charge carrier of the opposite type than the channel region to form a substantially completed power switching device such as Insulated Gate Bipolar Transistors.

The embodiments described herein allow a separation-enhancing species to be introduced into a substrate to allow more readily the separation of a surface layer of semiconductor material from the substrate. The separation of the surface layer of the semiconductor may also be carried out without using implementing any separation enhancing species. However, use of the separation-enhancing techniques can improve reproducibility of the thickness of the semiconductor layer from semiconductor device to semiconductor device. Ion implantation can be performed such that the projected range is controlled within a few microns from semiconductor device to semiconductor device. Even if the separation-enhancing species is not implanted, for example, movement of separation-enhancing species from a metallic layer into the substrate, thickness control is better than a mechanical tearing operation in the absence of the separation-enhancing species. Still further, the resulting surfaces of the semiconductor layers (along the separated zones) may be smoother when a separation-enhancing technique is performed, as compared to a mechanical tearing operation without the use of a separation-enhancing technique.

Thus, after reading this specification, skilled artisans will appreciate methods described herein can be used to form a semiconductor device with a metallic layer as a support on without the need for a separate substrate or handle to be used, such as during a mechanical tearing operation. In still further embodiments, when one of the separation-enhancing species includes hydrogen that moves from the metallic layer into the substrate, the separation operation can be further enhanced by implanting another separation-enhancing species, such as silicon, or by forming a brittle layer, such as porous semiconductor layer. In a particular embodiment, porous silicon may be achieved by implanting fluorine or chlorine into the substrate.

In an embodiment of the inventive concepts, the electronic device formed using the separation and patterning techniques described herein is a Power Metal-Oxide-Semiconductor Field-Effect Transistor (MOSFET). As illustrated in FIGS. 12A-12D, the Power MOSFET can be a p-channel depletion type (FIG. 12A), n-channel depletion type (FIG. 12B), p-channel enhancement type (FIG. 12C), or re-channel enhancement type (FIG. 12D) MOSFET.

In another embodiment of the inventive concepts, the electronic device formed using the separation and charge depletion techniques described herein yields a Complementary Metal Oxide Semiconductor (CMOS), a schematic of which is shown in FIG. 12F. The CMOS may be fabricated on a p-type substrate with an NMOS and a PMOS in an n-type well.

Note that not all of the activities described above in the general description or the examples are required, that a portion of a specific activity may not be required, and that one or more further activities may be performed in addition to those described. Still further, the order in which activities are listed is not necessarily the order in which they are performed.

While various aspects of the inventive concepts have been described herein with reference to example embodiments, it should be understood that the inventive concepts are not limited thereto. Those having ordinary skill in the art and access to the teachings provided herein will recognize additional modifications, applications, embodiments and substitution of equivalents all fall within the scope of the inventive concepts. Therefore, it should be understood that the above embodiments are not limiting, but illustrative. The scopes of the inventive concepts are to be determined by the broadest permissible interpretation of the following claims

What is claimed as new and desired to be protected by Letters Patent of the United States is:

1. A method of forming an electronic device, comprising:
    forming a plurality of channel structures over a first side of a semiconductor substrate, the plurality of channel structures substantially perpendicular to the first side of the semiconductor substrate;
    forming gate dielectric regions over a portion of the plurality of channel structures and planar regions;
    forming gate electrode regions over a portion of the gate dielectric regions;
    forming source regions and body tie regions on the walls of the plurality of channel structures;
    forming dielectric regions over the gate electrode regions to electrically isolate the gate electrode regions from the source regions;
    forming a first metallic layer over the first side of the semiconductor substrate;
    inducing stress within the semiconductor substrate by annealing and/or cooling the semiconductor substrate and the first metallic layer;
    separating a first portion of the semiconductor substrate and the first metallic layer from a second portion of the semiconductor substrate;
    forming backside metal regions over the first portion of the semiconductor substrate, the backside metal regions capable of being drain metal electrode contacts; and
    etching portions of the first metallic layer to form gate metal electrode contacts and source metal electrode contacts.

2. The method of claim 1, wherein the plurality of channel structures substantially perpendicular to the first side of the semiconductor substrate is comprised of walls.

3. The method of claim 1, wherein the plurality of channel structures substantially perpendicular to the first side of the semiconductor substrate is comprised of discrete pillars.

4. The method of claim 1, wherein during the step of separating the first portion of the semiconductor substrate, a characteristic texture forms on surface of the first portion of the semiconductor substrate and a complementary texture on the second portion of the semiconductor substrate.

5. The method of claim 1, wherein forming source regions and body tie regions includes forming regions with different dopants on opposite faces of portions of the channel structure above the gate electrode regions.

6. The method of claim 5, wherein the source region is doped with n-type or p-type dopant and the body tie region is doped with opposite type dopant.

7. The method of claim 1, wherein forming gate electrode regions over a portion of the gate dielectric regions comprises a method of photoresist spin and pattern followed by etch back to expose regions of the gate to be etched away.

8. The method of claim 1, wherein forming gate electrode regions over a portion of the gate dielectric regions comprises a method of chemical mechanical polishing and partial etch of the gate electrode regions.

9. The method of claim 1, wherein forming the first metallic layer comprises forming at least one of adhesion film, a barrier film, a seed film, or any combination thereof before initiating a first electrochemical process.

10. The method of claim 1, wherein separating the first portion of the semiconductor substrate comprises separating the first portion of the semiconductor substrate and the first metallic layer from the second portion of the semiconductor substrate using a mechanical tool.

11. The method of claim 10, wherein the mechanical tool is one of a wedge, wire, or saw.

* * * * *